(12) United States Patent
Mueller et al.

(10) Patent No.: US 11,639,558 B2
(45) Date of Patent: May 2, 2023

(54) METHOD FOR PRODUCING A SEMICONDUCTOR WAFER COMPOSED OF MONOCRYSTALLINE SILICON

(71) Applicant: Siltronic AG, Munich (DE)

(72) Inventors: Timo Mueller, Burghausen (DE);
Michael Boy, Waging am See (DE);
Michael Gehmlich, Weissenborn (DE);
Andreas Sattler, Trostberg (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 17/859,017

(22) Filed: Jul. 7, 2022

(65) Prior Publication Data

US 2022/0349089 A1 Nov. 3, 2022

Related U.S. Application Data

(63) Continuation of application No. 16/758,417, filed as application No. PCT/EP2018/077497 on Oct. 9, 2018, now abandoned.

(30) Foreign Application Priority Data

Oct. 26, 2017 (DE) ...................... 10 2017 219 255.0

(51) Int. Cl.
*C30B 29/06* (2006.01)
*C30B 33/02* (2006.01)
(Continued)

(52) U.S. Cl.
CPC .............. *C30B 29/06* (2013.01); *C30B 33/02* (2013.01); *H01L 21/30625* (2013.01);
(Continued)

(58) Field of Classification Search
CPC ............ H01L 21/3226; H01L 21/3225; H01L 21/30625; H01L 29/16; H01L 29/34; C30B 33/02; C30B 29/06
See application file for complete search history.

(56) References Cited

U.S. PATENT DOCUMENTS 6,306,733 B1 * 10/2001 Falster ................ H01L 21/3225
257/E21.321
6,641,888 B2 * 11/2003 Asayama ................ C30B 29/06
428/64.1

(Continued)

FOREIGN PATENT DOCUMENTS

EP 0889510 A1 1/1999
JP 2003115491 A 4/2003

(Continued)

*Primary Examiner* — Jose R Diaz
(74) *Attorney, Agent, or Firm* — Leydig, Voit & Mayer, Ltd.

(57) ABSTRACT

A method produces a single-crystal silicon semiconductor wafer. A single-crystal silicon substrate wafer is double side polished. A front side of the substrate wafer is chemical mechanical polished (CMP). An epitaxial layer of single-crystal silicon is deposited on the front side of the substrate wafer. A first rapid thermal anneal (RTA) treatment is performed on the coated substrate wafer at 1275-1295° C. for 15-30 seconds in argon and oxygen, having oxygen of 0.5-2.0 vol %. The coated substrate wafer is then cooled at or below 800° C., with 100 vol % argon. A second RTA treatment is performed on the coated substrate wafer at a 1280-1300° C. for 20-35 seconds in argon. An oxide layer is removed from a front side of the coated substrate wafer. The front side of the coated substrate wafer is polished by CMP.

6 Claims, 15 Drawing Sheets

(51) Int. Cl.
*H01L 21/306* (2006.01)
*H01L 21/322* (2006.01)
*H01L 29/16* (2006.01)
*H01L 29/34* (2006.01)

(52) U.S. Cl.
CPC ...... *H01L 21/3225* (2013.01); *H01L 21/3226* (2013.01); *H01L 29/16* (2013.01); *H01L 29/34* (2013.01)

(56) References Cited

U.S. PATENT DOCUMENTS

| | | |
|---|---|---|
| 6,808,781 B2 * | 10/2004 | Mule'Stagno ...... H01L 21/3225 257/E21.321 |
| 10,483,128 B2 | 11/2019 | Mueller et al. |
| 2002/0170631 A1 | 11/2002 | Falster et al. |
| 2005/0054124 A1 | 3/2005 | Mun et al. |
| 2005/0247259 A1 | 11/2005 | Yoon et al. |
| 2010/0105191 A1 | 4/2010 | Hayamizu et al. |
| 2010/0213168 A1 | 8/2010 | Haberecht |
| 2014/0141537 A1 | 5/2014 | Falster et al. |

FOREIGN PATENT DOCUMENTS

| | | |
|---|---|---|
| JP | 2006261632 A | 9/2006 |
| KR | 20050107642 A | 11/2005 |
| KR | 20150118037 A | 10/2015 |
| KR | 20170093924 A | 8/2017 |
| WO | WO 2018125565 A1 | 7/2018 |

* cited by examiner

METHOD FOR PRODUCING A SEMICONDUCTOR WAFER COMPOSED OF MONOCRYSTALLINE SILICON

CROSS-REFERENCE TO PRIOR APPLICATIONS

This application is a continuation of U.S. patent application Ser. No. 16/758,417, filed on Apr. 23, 2020, which is a U.S. National Phase Application under 35 U.S.C. § 371 of International Application No. PCT/EP2018/077497, filed on Oct. 9, 2018, and claims benefit to German Patent Application No. DE 10 2017 219 255.0, filed on Oct. 26, 2017. The International Application was published in German on May 2, 2019 as WO 2019/081201 under PCT Article 21(2). The entire contents of each of which are hereby incorporated by reference herein.

FIELD

The present invention relates to a method for producing a semiconductor wafer made of single-crystal silicon having a front side and a back side.

BACKGROUND

A denuded zone is a region of a semiconductor wafer that extends from the front side in the direction of the back side over a certain depth and in which oxygen precipitates known as BMDs (bulk micro defects) are not formed. The denuded zone is typically intended as a location for accommodating electronic components.

Adjacent to the denuded zone is a region that extends further into the interior (bulk) of the semiconductor wafer and contains BMD Nuclei. BMD Nuclei are developed into BMDs by means of a heat treatment. BMDs act as so-called internal getters, which in particular can bond metallic impurities. The development of BMD Nuclei into BMDs is also possible in the course of a heat treatment that is used primarily for construction of electronic components in the denuded zone.

The presence of vacancies in the single crystal is advantageous when comparatively high densities of BMDs are sought. US 2002/0170631 A1 describes a process for producing a semiconductor wafer of single-crystal silicon with a deep denuded zone. The process includes a heat treatment (RTA treatment, rapid thermal anneal) of the semiconductor wafer, which includes a short-duration rapid heating and cooling of the semiconductor wafer. The RTA treatment is to be performed in an atmosphere containing oxygen in a concentration of not less than 100 ppma and not more than 10,000 ppma. The described process is moreover conceived so as to form a concentration profile of vacancies in which the peak density of vacancies is achieved in the middle between the front side and the back side of the semiconductor wafer or near to the middle. Since the concentration profiles of the vacancies, of the BMDs seeds and of the BMDs correlate the peak density of BMDs is likewise found in the middle or near to the middle.

The production of modern integrated circuits with 3-D architecture necessitates the provision of a denuded zone which extends comparatively deep into the semiconductor wafer and an adjoining region including BMD Nuclei which may be developed into BMDs, wherein the distance between the BMDs and the denuded zone should be as small as possible. One known procedure includes through silicon via (TSV) fabrication and grinding-back of the semiconductor wafer from the back side until far beyond the middle of the semiconductor wafer (M. Motoyoshi, Proceedings of the IEEE, Vol. 97, No. 1, January 2009). The proximity of the BMDs to the denuded zone is said to ensure that in the ground-back semiconductor wafer too there is a sufficient density of getter centres, in particular even during construction of structures of electronic components.

SUMMARY

A method produces a semiconductor wafer of single-crystal silicon. The method includes: providing a substrate wafer of single-crystal silicon; polishing the substrate wafer by double side polishing (DSP); polishing a front side of the substrate wafer by chemical mechanical polishing (CMP); depositing at least one epitaxial layer of single-crystal silicon on the front side of the substrate wafer creating a coated substrate wafer; loading a rapid thermal anneal (RTA) reactor with the coated substrate wafer; performing a first RTA treatment of the coated substrate wafer at a temperature in a temperature range of not less than 1275° C. and not more than 1295° C. for a period of not less than 15 seconds and not more than 30 seconds in an atmosphere of argon and oxygen having a proportion of oxygen of not less than 0.5 vol % and not more than 2 vol %; cooling the coated substrate wafer after the first RTA treatment to a temperature of not more than 800° C., wherein a gas feed to the coated substrate wafer is set to 100 vol % argon; performing a second RTA treatment of the coated substrate wafer at a temperature in a temperature range of not less than 1280° C. and not more than 1300° C. for a period of not less than 20 seconds and not more than 35 seconds in an atmosphere of argon; removing an oxide layer from a front side of the coated substrate wafer; and polishing the front side of the coated substrate wafer by CMP.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
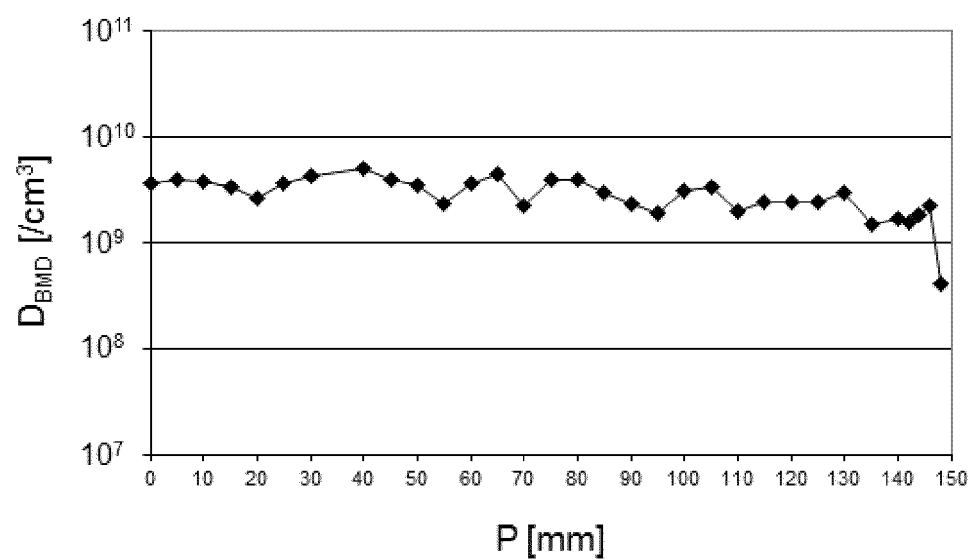
FIG. 1 and FIG. 2 respectively show the radial profile of the average density of BMDs using example representatives of semiconductor wafers.

The present disclosure provides a semiconductor wafer of single-crystal silicon that better fulfils the recited requirements.

An embodiment of the present disclosure provides a semiconductor wafer of single-crystal silicon, including: a polished front side and a back side; a denuded zone, that extends from the polished front side toward the back side to a depth of not less than 30 µm; and a region adjacent to the denuded zone and including BMD Nuclei, which may be developed into BMDs. A density of the BMDs at a distance of 120 µm from the front side is not less than $2 \times 10^8$ cm$^{-3}$.

The semiconductor wafer of single crystalline silicon is either an uncoated semiconductor wafer or a semiconductor wafer coated with at least one epitaxial layer. When the semiconductor wafer of single-crystal silicon is coated with an epitaxial layer, the upper surface of the epitaxial layer forms the front side of the semiconductor wafer. The at least one epitaxial layer preferably has a thickness of not less than 1 µm and not more than 5 µm.

An embodiment of the present disclosure provides a semiconductor wafer made of single-crystal silicon having a front side and a back side. The semiconductor wafer has a denuded zone, which extends from the front side in the direction of the back side to a certain depth and a region which is adjacent to the denuded zone and contains BMD Nuclei.

In a first preferred embodiment of the present disclosure, the semiconductor wafer of single-crystal silicon is an uncoated substrate wafer of single-crystal silicon whose denuded zone extends from the polished front side to a depth of not less than 45 µm. The semiconductor wafer in the region adjacent to the denuded zone includes BMD Nuclei after whose development into BMDs, the density of the BMDs at a distance of 120 µm from the front side is not less than $3 \times 10^9$ cm$^{-3}$.

In a second preferred embodiment of the present disclosure, the semiconductor wafer of single-crystal silicon is a substrate wafer of single-crystal that is coated with at least one epitaxial layer of single-crystal silicon and has a denuded zone that extends from the polished front side of the coated substrate wafer to a depth of not less than 45 µm. The semiconductor wafer in the region adjacent to the denuded zone includes BMD Nuclei after whose development into BMDs, the density of the BMDs at a distance of 120 µm from the front side is not less than $3 \times 10^9$ cm$^{-3}$.

The at least one epitaxial layer has a thickness of preferably not less than 1 µm and not more than 5 µm. The semiconductor wafer of the second preferred embodiment of the present disclosure is preferably an epitaxial coated substrate wafer with n/n⁻ doping or p/p⁻ doping. The dopant of the n-type is preferably phosphorous and the dopant of the p-type is preferably boron.

In a third preferred embodiment of the invention, the semiconductor wafer of single-crystal silicon is an uncoated substrate wafer of single-crystal silicon, which has a denuded zone that extends from the polished front side to a depth of not less than 30 µm. The semiconductor wafer in the region adjacent to the denuded zone includes BMD Nuclei after whose development into BMDs, the density of the BMDs at a distance of 120 µm from the front side is not less than $2 \times 10^8$ cm$^{-3}$. Producing a semiconductor wafer of the third embodiment of the invention requires a comparatively small number of process steps.

An inventive semiconductor wafer of single-crystal silicon includes, in a region below the denuded zone, BMD Nuclei, which may be developed into BMDs. It is preferable that the density of developed BMDs decreases from a peak density in the direction of the central plane. The semiconductor wafer of single-crystal silicon may be ground back to a residual thickness from the back side, while preferably retaining the region in which the peak density of BMDs may be developed.

In the denuded zone, the lifetime of minority charge carriers is preferably greater than 1000 µs on average.

The back side of an embodiment of a semiconductor wafer of single-crystal silicon is preferably burdened with not more than 100 defects.

The production of a semiconductor wafer of the first preferred embodiment of the present disclosure includes the following process steps:
  providing a substrate wafer of single-crystal silicon;
  polishing the substrate wafer by DSP;
  loading an RTA reactor with the substrate wafer;
  a first RTA treatment of the substrate wafer at a temperature in a temperature range of not less than 1275° C. and not more than 1295° C. for a period of not less than 15 s and not more than 30 s in an atmosphere consisting of argon and oxygen having a proportion of oxygen of not less than 0.5 vol % and not more than 2 vol %;
  cooling the substrate wafer after the first RTA treatment to a temperature of not more than 800° C., wherein a gas feed to the semiconductor wafer is reset to 100 vol % argon;
  a second RTA treatment of the substrate wafer at a temperature in a temperature range of not less than 1280° C. and not more than 1300° C. for a period of not less than 20 s and not more than 35 s in an atmosphere consisting of argon;
  removing an oxide layer from a front side of the semiconductor wafer; and polishing the front side of the substrate wafer by CMP.

DSP (double side polishing) is a polishing procedure in the course of which the front side and the back side of a substrate wafer are polished simultaneously.

CMP (chemical mechanical polishing) is a polishing procedure in the course of which the front side or the back side of a substrate wafer is polished.

The oxide layer present on the substrate wafer after the first RTA treatment is removed from the front side of the substrate wafer, preferably by treating the substrate wafer with aqueous HF solution. The aqueous HF solution preferably contains not less than 0.5% by weight of HF and not more than 2% by weight of HF and the duration of the treatment is preferably not less than 150 s and not more than 350 s.

The production of a semiconductor wafer of the second preferred embodiment of the present disclosure includes the following process steps:
  providing a substrate wafer of single-crystal silicon;
  polishing the substrate wafer by DSP;
  polishing the front side of the substrate wafer by CMP;
  depositing at least one epitaxial layer of single-crystal silicon on the front side of the substrate wafer;
  loading an RTA reactor with the coated substrate wafer;
  a first RTA treatment of the coated substrate wafer at a temperature in a temperature range of not less than 1275° C. and not more than 1295° C. for a period of not less than 15 s and not more than 30 s in an atmosphere consisting of argon and oxygen having a proportion of oxygen of not less than 0.5 vol % and not more than 2 vol %;
  cooling of the coated substrate wafer after the first RTA treatment to a temperature of not more than 800° C., wherein a gas feed to the semiconductor wafer is reset to 100 vol % argon;

a second RTA treatment of the coated substrate wafer at a temperature in a temperature range of not less than 1280° C. and not more than 1300° C. for a period of not less than 20 s and not more than 35 s in an atmosphere consisting of argon;

removing an oxide layer from a front side of the coated substrate wafer; and polishing the front side of the coated substrate wafer by CMP.

The oxide layer present on the coated substrate wafer after the first RTA treatment is removed from the front side of the coated substrate wafer, preferably by treating the coated substrate wafer with aqueous HF solution. The aqueous HF solution preferably contains not less than 0.5% by weight of HF and not more than 2% by weight of HF and the duration of the treatment is preferably not less than 150 s and not more than 350 s.

The deposition of the at least one epitaxial layer on the substrate wafer is preferably carried out by CVD (chemical vapour deposition) and preferably in a single wafer reactor, for example such as is described in US 2010/0213168 A1. A preferred deposition gas contains trichlorosilane as the silicon source. The deposition temperature is then preferably not less than 1110° C. and not more than 1180° C., particularly preferably 1130° C. Furthermore, the deposition gas preferably contains a dopant of the n-type or of the p-type.

The production of a semiconductor wafer of the third preferred embodiment of the present disclosure includes the following process steps:

providing a substrate wafer of single-crystal silicon;
loading an RTA reactor with the substrate wafer;
a first RTA treatment of the substrate wafer at a temperature in a temperature range of not less than 1250° C. and not more than 1310° C. for a period of not less than 5 s and not more than 40 s in an atmosphere consisting of nitrogen and oxygen having a proportion of oxygen of not less than 0.5 vol % and not more than 3.0 vol %;
cooling the substrate wafer after the first RTA treatment to a temperature of not more than 800° C., wherein a gas feed to the substrate wafer is reset to 100 vol % argon;
a second RTA treatment of the substrate wafer at a temperature in a temperature range of not less than 1280° C. and not more than 1300° C. for a period of not less than 20 s and not more than 35 s in an atmosphere consisting of argon;
polishing the substrate wafer by DSP; and
polishing the front side of the substrate wafer by CMP.

The oxide layer present on the substrate wafer after the first RTA treatment is removed from the front side of the substrate wafer by polishing the substrate wafer by DSP. The thus achieved material removal from the front side and the back side of the substrate wafer is preferably not less than 8 μm in each case.

The step of providing a substrate wafer of a single crystalline silicon is a step recited at the beginning of the production processes described. The substrate wafer is preferably cut from a single crystal of single-crystal silicon pulled by the CZ method and subjected to further processing. In the CZ method silicon is melted in a crucible made of quartz and the single-crystal grows at the end of a seed crystal which is immersed in the resulting melt and raised. The crucible material is partially dissolved by contact with the melt and in this way provides oxygen later required for developing BMDs.

The single crystal of single-crystal silicon preferably has a diameter of not less than 300 mm. The substrate wafer cut from the single crystal preferably originates from n region. N region describes single crystal silicon which contains neither agglomerates of vacancies nor agglomerates of silicon interstitial atoms nor OSF defects (oxidation induced stacking faults). Such material is formed for example when the single-crystal is pulled according to the CZ method and the V/G ratio of pulling speed V and axial temperature gradient G at the crystallization boundary is controlled such that it remains between critical limits.

The single-crystal from which the provided substrate wafer of single-crystal silicon is cut is preferably not intentionally doped with nitrogen or carbon. Accordingly the provided substrate wafer of single-crystal silicon contains nitrogen in a concentration of preferably not more than $3 \times 10^{12}$ atoms/cm$^3$ and carbon in a concentration of preferably not more than $2.5 \times 10^{15}$ atoms/cm$^3$. The concentration of oxygen in the provided substrate wafer is preferably not less than $4.5 \times 10^{17}$ atoms/cm$^3$ and not more than $5.5 \times 10^{17}$ atoms/cm$^3$, taking account of the calibration factor as per new ASTM.

The substrate wafer cut from the single-crystal may be subjected to further processing using mechanical and chemical processing steps such as grinding and etching. It is preferable to provide a substrate wafer of single-crystal silicon that has been subjected to at least one material-removing processing operation. The last material-removing treatment carried out before providing the substrate wafer is preferably a treatment by etching.

The provided and optionally epitaxial coated substrate layer of single-crystal silicon is loaded into an RTA reactor and in the course of the first RTA treatment, preferably heated to the target temperature at a rate of not less than 50° C./s.

Following the first RTA treatment, the provided and optionally epitaxial coated substrate layer remains in the RTA reactor and is cooled, preferably to a temperature of not more than 800° C. The cooling rate is preferably not less than 30° C./s. The gas feed into the RTA reactor is simultaneously switched to 100% argon.

The provided and optionally epitaxial coated substrate layer of single-crystal silicon is, in the course of the second RTA treatment, preferably heated to the target temperature at a rate of not less than 50° C./s.

The period between the end of the first RTA treatment and the beginning of the second RTA treatment is preferably not less than 25 s and not more than 50 s.

Burdening of a semiconductor wafer according to the present disclosure (according to the first, second and third embodiment) with defects is preferably curtailed by passing oxygen (100 vol %) through the RTA reactor prior to the first RTA treatment, preferably with a flowrate of not less than 8 slm and not more than 18 slm (standard litres per minute). The defect burden of the semiconductor wafer may be analysed using a high-resolution laser scattering system for example. Analysis results contained herein were obtained in part using an edge and back side inspection module (EBI) from Rudolph Technologies which allows for determination of defects such as particles, scratches, surface defects and haze on the back side and in part with a KLA Tencor Surfscan SP3 inspection system which detects LLS defects (localized light scatterers) on the front side.

An embodiment of the present disclosure provides a semiconductor wafer of single-crystal silicon, which includes a region having BMD Nuclei, which is located below the denuded zone and is adjacent to the denuded zone. BMD Nuclei are centres including vacancies where BMDs may develop after a precipitation heat treatment. The precipitation heat treatment is not a constituent of a process for producing a semiconductor wafer according to the present disclosure but is used to test whether BMDs can be developed in the required density or to develop BMDs that exhibit their activity as getter centres. The precipitation heat treatment is accordingly performed either as a test or preferably in the course of a further processing of the semiconductor wafer of single-crystal silicon into electronic components.

A typical precipitation heat treatment for test purposes consists of a two-stage precipitation heat treatment of the semiconductor wafer according to the present disclosure under oxygen at a temperature of 780° C. for a duration of 3 h (stage 1, stabilization step) and at a temperature of 1000° C. for a duration of 16 h (stage 2, growth step).

The density of the developed BMDs may be determined along a broken edge of the semiconductor wafer for example by IR laser scattering tomography as the analytical method using an MO-441 detector from Raytex Corporation, Japan. Evaluation of the measured results is typically performed by plotting in a diagram the average density of BMDs ($D_{BMD}$) along the radius of the semiconductor wafer (averaged over a depth of 7-300 μm at each radial position of measurement, wherein the BMD defect density is measured every 5 μm in the depth axis) for example at least 25 radial positions of measurement P which are equidistant from one another. Also determined at the radial positions of measurement P is the distance DZ1 from the first encountered BMD to the front side, this distance being plotted in a diagram along the radius of the semiconductor wafer. The arithmetic average of the distances DZ1 represents the depth to which the denuded zone extends from the polished front side into the interior of the semiconductor wafer. Also plottable in a diagram is the average size $s_{av}$ of BMDs (measured over a depth of 7-300 μm at each radial position of measurement, the BMD defect size being measured in the depth axis every 5 μm) as a function of the radial position of measurement P and also the profile of the density of BMDs ($D_{BMD}$) in the depth direction, i.e. along the distance d to the front side of the semiconductor wafer, based on a particular radial position of measurement P.

The present disclosure is further elucidated herein below with the aid of examples and with reference to drawings.

Substrate wafers of single-crystal silicon having a diameter of 300 mm were provided. The substrate wafers consisted of n region and had surfaces in an etched state. A first portion of the substrate wafers was subjected to the process according to the present disclosure for producing semiconductor wafers according to the first preferred embodiment.

Prior to the first RTA treatment, oxygen (100 vol %) was passed through the RTA reactor at a flowrate of 10 slm. The first RTA treatment was then undertaken at a temperature of 1290° C. in an atmosphere of argon and oxygen (oxygen proportion 1 vol %). The duration of the first RTA treatment at this temperature was 20 s. The substrate wafers were subsequently cooled to a temperature of 600° C. and held at this temperature over a period of 40 s while the gas feed to the semiconductor wafers was switched to 100% argon. This was followed by the second RTA treatment at a temperature of 1295° C. and in an argon atmosphere over a period of 30 s.

The oxide layer formed was then removed from the substrate wafers and the front sides of the substrate wafers polished by CMP. The resulting semiconductor wafers according to the first embodiment of the present disclosure were subjected to the two-stage precipitation heat treatment provided for test purposes.

A second portion of the substrate wafers was subjected to the process according to the invention for producing semiconductor wafers according to the third preferred embodiment.

Prior to the first RTA treatment, oxygen (100 vol %) was passed through the RTA reactor at a flowrate of 10 slm. The first RTA treatment was then undertaken at a temperature of 1290° C. in an atmosphere composed of nitrogen and oxygen (oxygen proportion 1 vol %). The duration of the first RTA treatment at this temperature was 20 s. The substrate wafers were subsequently cooled to a temperature of 600° C. and held at this temperature over a period of 40 s while the gas feed to the semiconductor wafers was switched to 100% argon.

This was followed by the second RTA treatment at a temperature of 1295° C. and in an argon atmosphere over a period of 30 s.

The substrate wafers were subsequently polished initially by DSP and then by CMP and the resulting semiconductor wafers according to the third embodiment of the present disclosure were likewise subjected to the two-stage precipitation heat treatment provided for test purposes.

Figure 2:
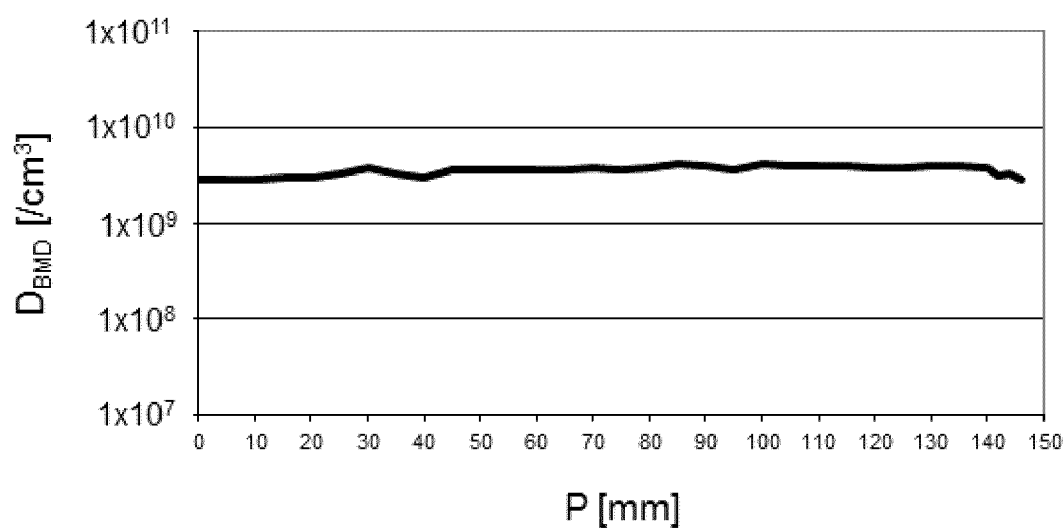

FIG. 1 and FIG. 2 respectively show the radial profile of the average density $D_{BMD}$ of BMDs using the example of representatives of semiconductor wafers of the first embodiment (FIG. 1) and of the third embodiment (FIG. 2).

Figure 3:
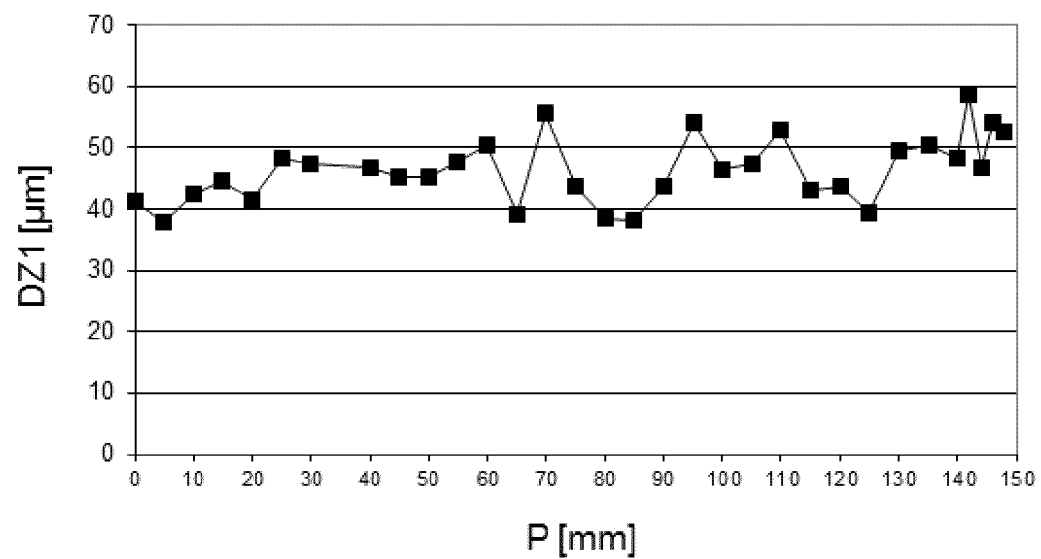
FIG. 3 and FIG. 4 respectively show the radial profile of the distance using example representatives of semiconductor wafers.
Figure 4:
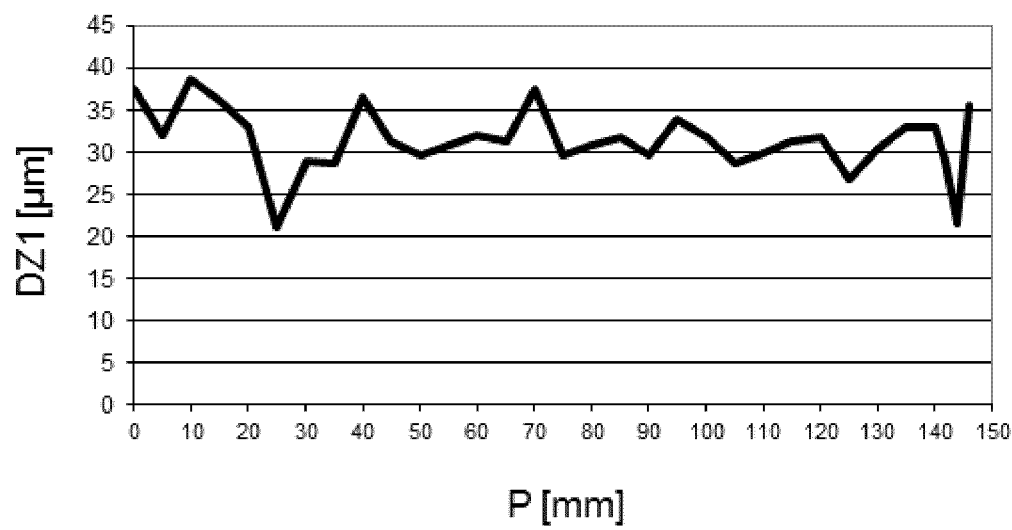

FIG. 3 and FIG. 4 respectively show the radial profile of the distance DZ1 using the example of representatives of semiconductor wafers of the first embodiment (FIG. 3) and of the third embodiment (FIG. 4) with a corresponding depth of the denuded zone of not less than 45 μm (FIG. 3) and of not less than 30 μm (FIG. 4).

Figure 5:
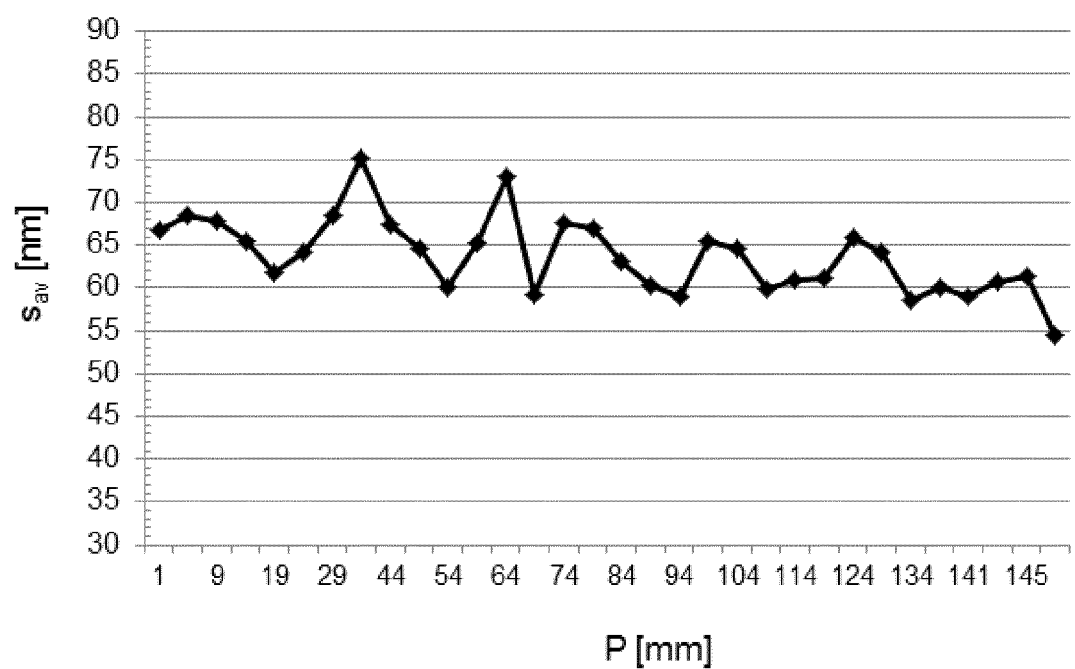
FIG. 5 and FIG. 6 respectively show the average size of the BMDs as a function of their radial position using example representatives of semiconductor wafers.
Figure 6:
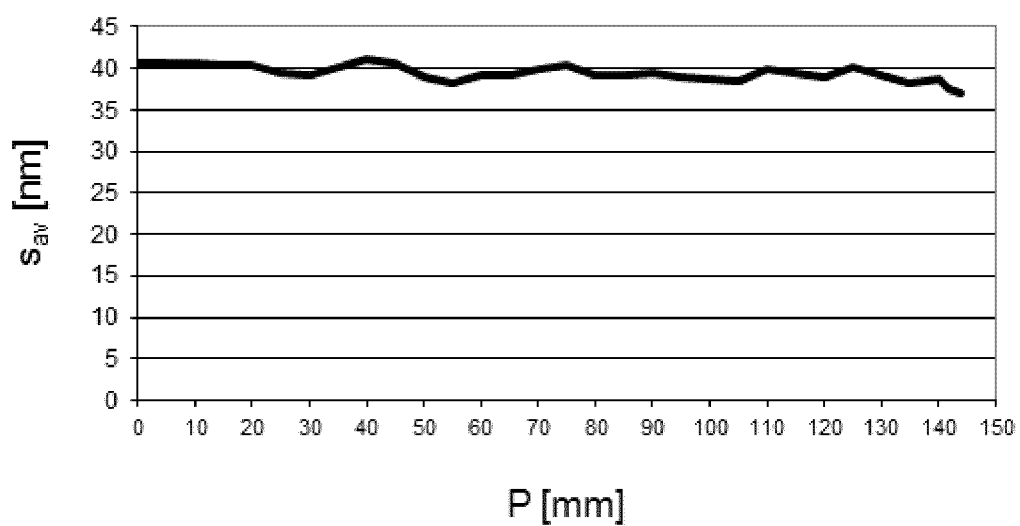

FIG. 5 and FIG. 6 respectively show the average size $s_{av}$ of the BMDs as a function of their radial position using the example of representatives of semiconductor wafers of the first embodiment (FIG. 5) and of the third embodiment (FIG. 6).

Figure 7:
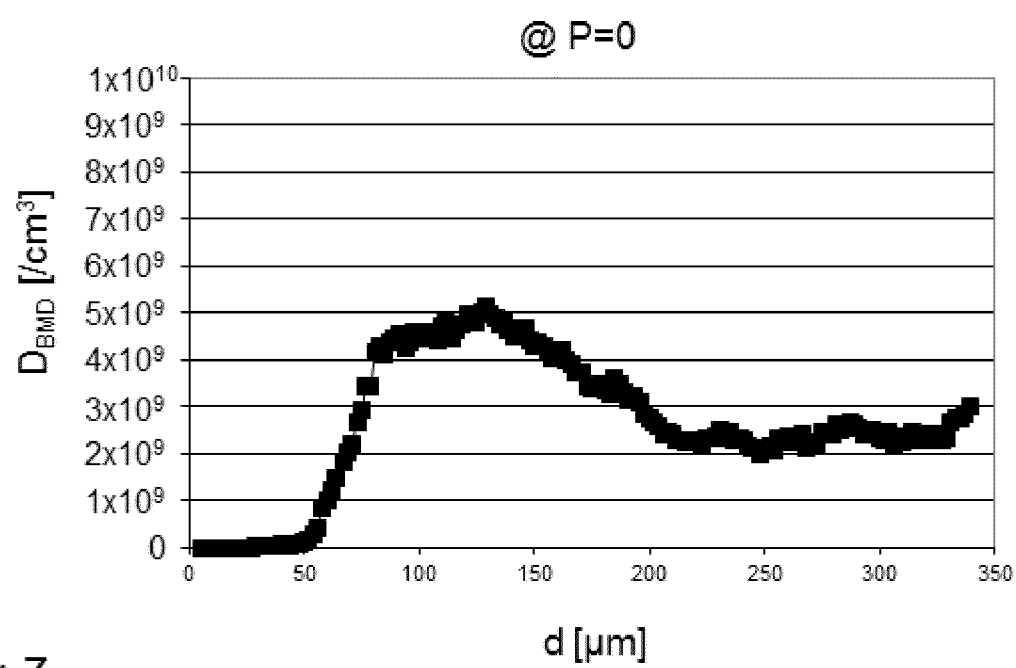
FIG. 7 to FIG. 12 respectively show a depth profile of the density of BMDs using the example representatives of semiconductor wafers.
Figure 8:
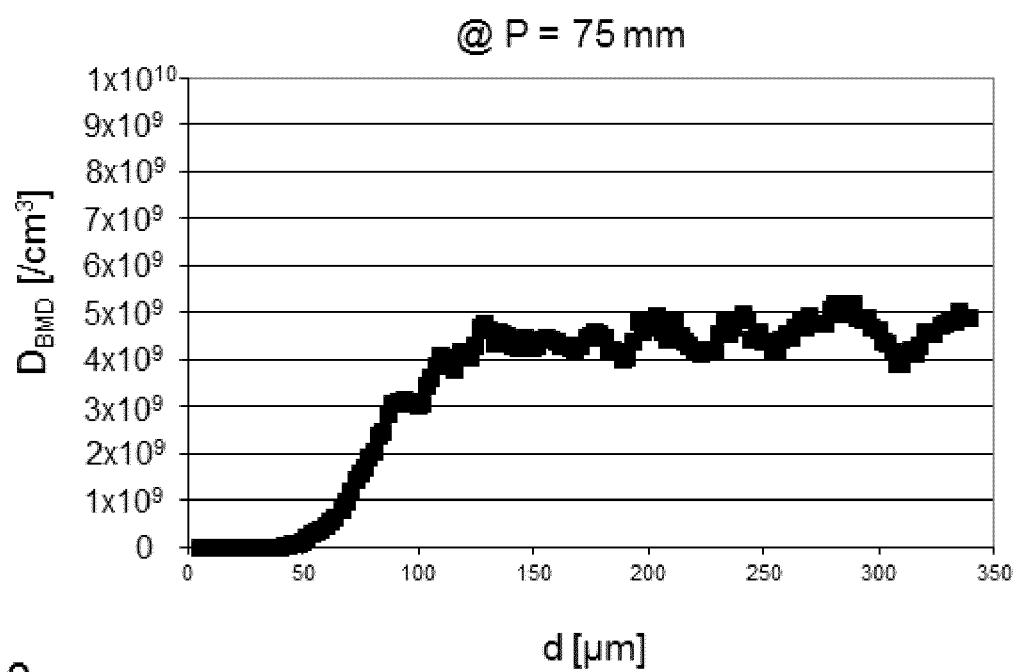
Figure 9:
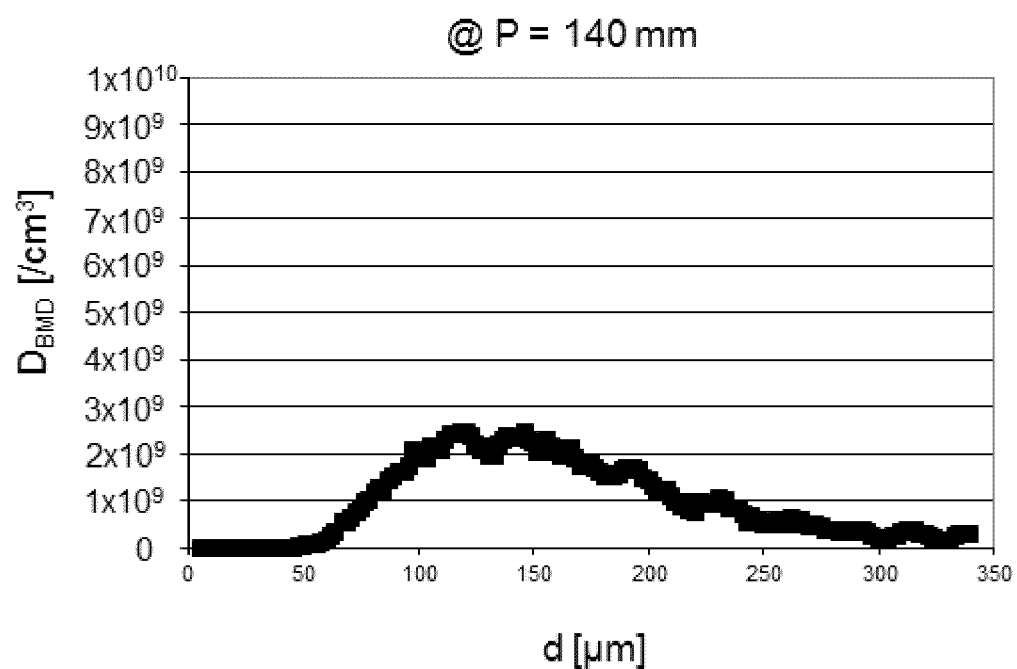
Figure 10:
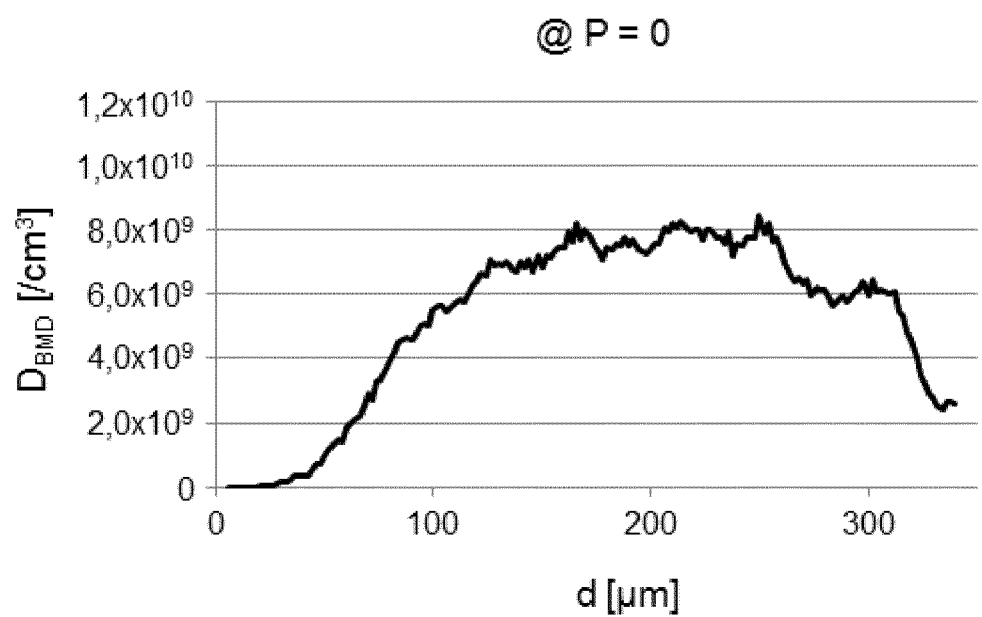
Figure 11:
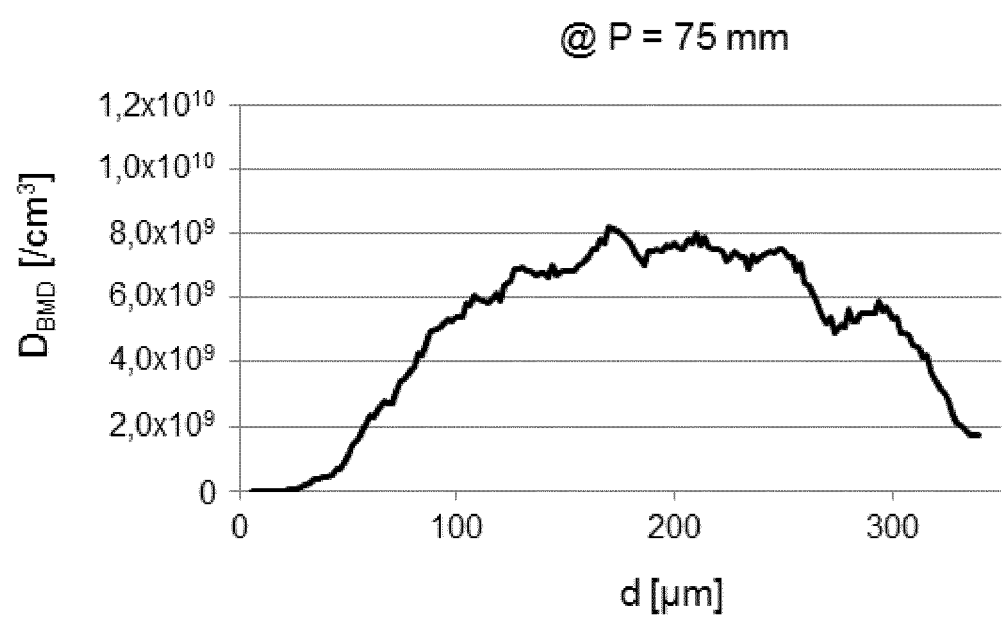
Figure 12:
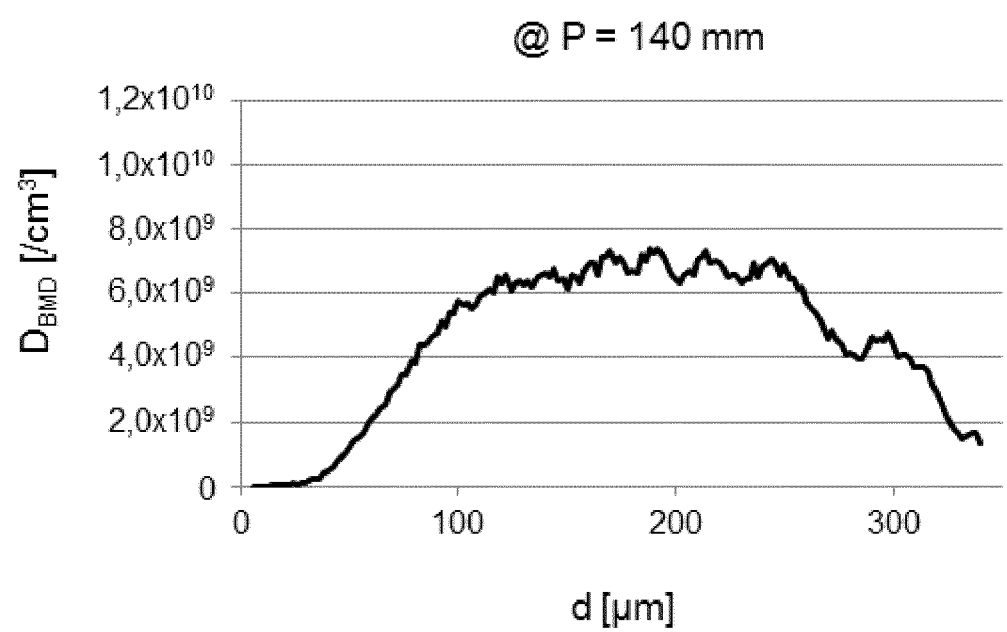

FIG. 7 to FIG. 12 respectively show a depth profile of the density $D_{BMD}$ of BMDs using the example of representatives of semiconductor wafers of the first embodiment (FIG. 7, FIG. 8 and FIG. 9) and of the third embodiment (FIG. 10, FIG. 11 and FIG. 12), wherein the depth profile in the centre (P=0 mm; FIG. 7 and FIG. 10), at half radius (P=75 mm; FIG. 8 and FIG. 11) and at the radial distance P=140 mm (FIG. 9 and FIG. 12) was determined.

Figure 13:
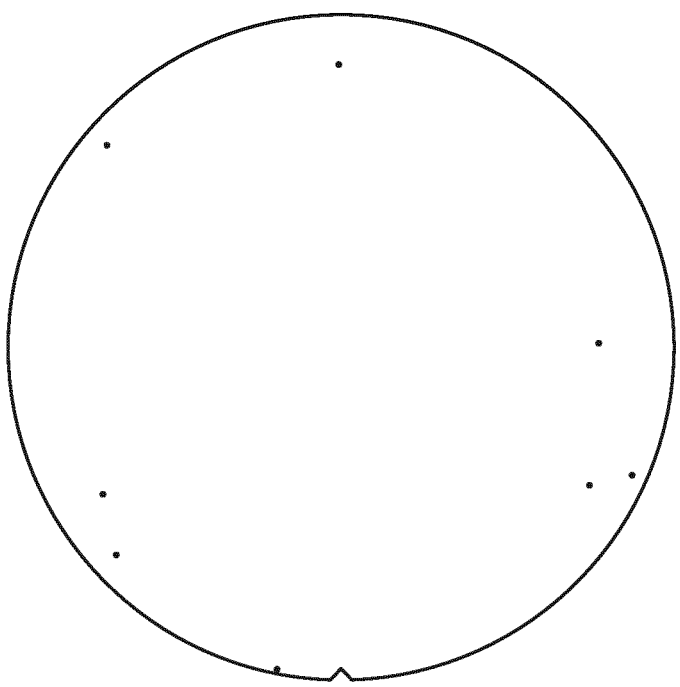
FIG. 13 and FIG. 14 show analysis results obtained after analysis of the back sides of representatives semiconductor wafers.
Figure 14:
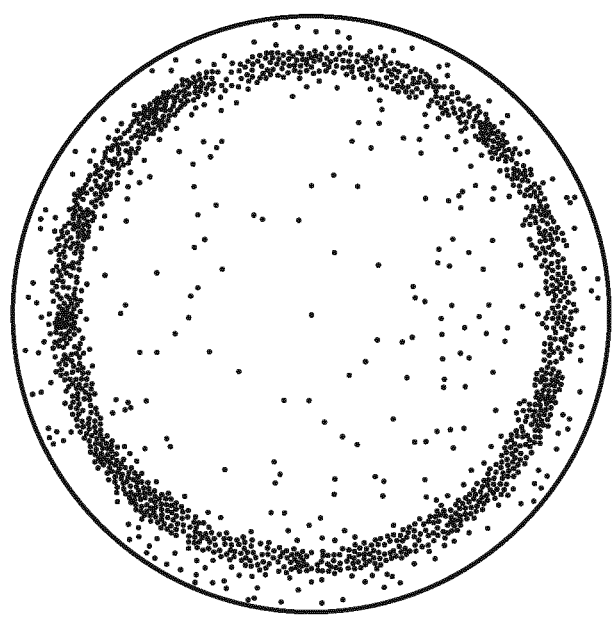
Figure 15:
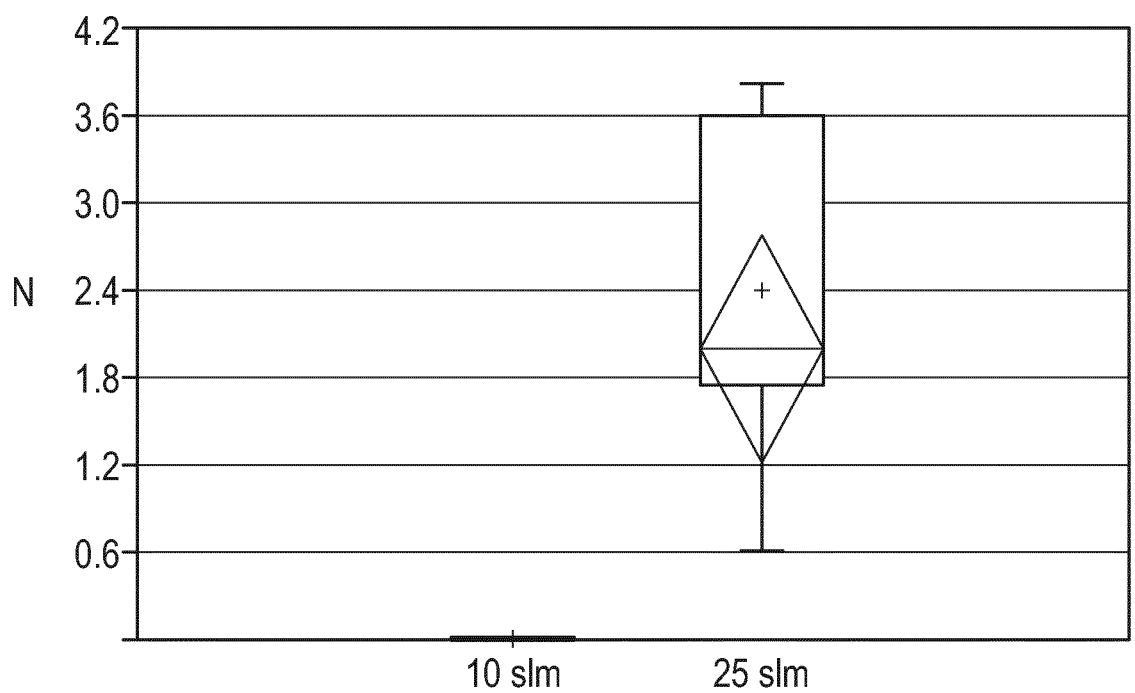
FIG. 15 shows this difference with reference to a box whisker plot.

FIG. 13 and FIG. 14 show analysis results obtained after analysis of the back sides of representatives of the semiconductor wafers with the abovementioned edge and back side inspection module (EBI). FIG. 13 shows a typical defect burden of the back side of an inventive semiconductor wafer of 8 defects greater than 0.2 μm and less than 100 defects, wherein during production of the semiconductor wafer care was taken to ensure that pure oxygen was passed through the RTA reactor at a flowrate of 10 slm prior to the first RTA treatment. If the passing of oxygen through the reactor is dispensed with the defect burden of the back side is markedly greater and annular defect regions having high defect densities are detectable (FIG. 14) (all defects larger than 0.2 μm were in turn measured and depicted). On the other hand it is not advantageous to set the flowrate of the oxygen to values of for example 25 slm prior to the first RTA treatment. In this case the number of LLS defects having a latex sphere equivalent of ≥0.13 μm is unacceptably high. This is not the case when the flow rate of the oxygen is selected to fall within the range of not less than 8 slm and not more than 18 slm. FIG. 15 shows this difference with reference to a box whisker plot, wherein the number N of LLS defects has been normalized. It is generally advantageous to recondition the oxidation state of the RTA reactor at regular intervals by running in the presence of wafer dummies. This is preferably carried out in an ambient of Ar/O$_2$ having an O$_2$ vol % proportion of 75-100% and a flow of 20-25 slm.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for producing a semiconductor wafer of single-crystal silicon, the method comprising:
    providing a substrate wafer of single-crystal silicon;
    polishing the substrate wafer by double side polishing (DSP);
    polishing a front side of the substrate wafer by chemical mechanical polishing (CMP);
    depositing at least one epitaxial layer of single-crystal silicon on the front side of the substrate wafer creating a coated substrate wafer;
    loading a rapid thermal anneal (RTA) reactor with the coated substrate wafer;
    performing a first RTA treatment of the coated substrate wafer at a temperature in a temperature range of not less than 1275° C. and not more than 1295° C. for a period of not less than 15 seconds and not more than 30 seconds in an atmosphere consisting of argon and oxygen having a proportion of oxygen of not less than 0.5 vol % and not more than 2 vol %;
    cooling the coated substrate wafer after the first RTA treatment to a temperature of not more than 800° C., wherein a gas feed to the coated substrate wafer is set to 100 vol % argon;
    performing a second RTA treatment of the coated substrate wafer at a temperature in a temperature range of not less than 1280° C. and not more than 1300° C. for a period of not less than 20 seconds and not more than 35 seconds in an atmosphere consisting of argon;
    removing an oxide layer from a front side of the coated substrate wafer; and
    polishing the front side of the coated substrate wafer by CMP.

2. The method according to claim 1, wherein the oxide layer is removed by treating the coated substrate wafer with aqueous HF solution.

3. The method according to claim 1, wherein 100 vol % of oxygen is passed through the RTA reactor prior to the first RTA treatment.

4. The method according to claim 1, wherein the produced semiconductor wafer of single-crystal silicon has the front side polished and a back side polished, has a denuded zone, which extends from the polished front side toward the polished back side to a depth of not less than 30 µm, and has a region adjacent to the denuded zone and including (bulk micro defects) BMD nuclei, a density of the BMDs at a distance of 120 µm from the polished front side being not less than 2×108 cm-3.

5. The method of claim 1, wherein the at least one epitaxial layer has a thickness of not less than 1 µm and not more than 5 µm, with n/n-doping or p/p-doping, a dopant of an n-type being phosphorous and a dopant of a p-type is being boron.

6. The method according to claim 1, wherein the produced semiconductor wafer of single-crystal silicon has a density of developed BMDs that decreases from a peak density in a direction of a central plane.

* * * * *